(12) United States Patent
Van Rens et al.

(10) Patent No.: US 8,222,635 B2
(45) Date of Patent: Jul. 17, 2012

(54) METHOD FOR MANUFACTURING AN ORGANIC LIGHT EMITTING DEVICE AS WELL AS SUCH A DEVICE

(75) Inventors: Bas Jan Emile Van Rens, Son (NL); Ruediger Lange, Waalre (NL)

(73) Assignee: OTB Solar B.V., Eindhoven (NL)

( * ) Notice: Subject to any disclaimer, the term of this patent is extended or adjusted under 35 U.S.C. 154(b) by 240 days.

(21) Appl. No.: 12/532,044

(22) PCT Filed: Mar. 20, 2007

(86) PCT No.: PCT/NL2007/050116
§ 371 (c)(1),
(2), (4) Date: Dec. 8, 2009

(87) PCT Pub. No.: WO2008/115045
PCT Pub. Date: Sep. 25, 2008

(65) Prior Publication Data
US 2010/0084641 A1    Apr. 8, 2010

(51) Int. Cl.
*H01L 35/24* (2006.01)
(52) U.S. Cl. .................. 257/40; 257/642; 257/E21.033; 257/E21.266; 257/E51.027; 257/E31.004; 438/82; 438/99
(58) Field of Classification Search .................... 257/40, 257/642, E21.033, E21.266, E31.004, E51.027; 438/82, 99
See application file for complete search history.

(56) References Cited

U.S. PATENT DOCUMENTS

| 2002/0140347 A1 | 10/2002 | Weaver |
| 2003/0045016 A1 | 3/2003 | Saito et al. |
| 2004/0211966 A1 | 10/2004 | Guenther et al. |
| 2005/0248270 A1 | 11/2005 | Ghosh et al. |

FOREIGN PATENT DOCUMENTS

| EP | 0 971 564 A2 | 1/2000 |
| JP | 2002-100469 A | 4/2002 |
| JP | 2003-282241 A | 10/2003 |
| JP | 2006-164737 A | 6/2006 |
| WO | WO-2006/071106 A1 | 7/2006 |

*Primary Examiner* — Andy Huynh
(74) *Attorney, Agent, or Firm* — Birch, Stewart, Kolasch & Birch, LLP

(57) ABSTRACT

An electronic device includes at least a substrate, an area on the substrate which has to be protected against moisture and/or oxygen, at least one contact, and an encapsulation layer system including at least a first inorganic layer. The at least one contact extends from the sealed area to a part of the substrate not sealed by the encapsulation layer system. The contact includes a shunt, which is an interruption bridged by an electrically conductive bridge. The first inorganic layer of the encapsulation system is applied so that it is in direct physical contact with the electrically conductive bridge. The bridge has a structure and shape which can be sealingly covered by the encapsulation layer system and is made from a material through which no moisture and/or oxygen can penetrate.

31 Claims, 6 Drawing Sheets

METHOD FOR MANUFACTURING AN ORGANIC LIGHT EMITTING DEVICE AS WELL AS SUCH A DEVICE

The invention provides a method for manufacturing an electronic device comprising at least:
providing a substrate;
providing an area on the substrate which has to be protected against moisture and/or oxygen;
providing at least one contact;
providing an encapsulation layer system comprising at least a first inorganic layer which is the first inorganic layer of the encapsulation system applied when forming the encapsulation system, the encapsulation system at least sealing the area to be protected against moisture and/or oxygen;
the at least one contact extending from the said sealed area to a part of the substrate not sealed by the encapsulation layer system.

The invention also relates to an electronic device comprising at least:
a substrate;
an area on the substrate which has to be protected against moisture and/or oxygen;
at least one contact;
an encapsulation layer system comprising at least a first inorganic layer which is the first inorganic layer of the encapsulation system applied when forming the encapsulation system, the encapsulation system at least sealing the area to be protected against moisture and/or oxygen;
the at least one contact extending from the said sealed area to a part of the substrate not sealed by the encapsulation layer system.

Such a device could e.g. be an organic light emitting device both of the passive and the active type, a solar cell, an organic electronic device, an organic solar cell or Si-devices of which an area, e.g. an sensor area, has to be protected against moisture or oxygen by means of an encapsulation layer system.

Such a method and a device are known from WO2006/071106 relating to an organic light emitting device. In this publication the following is stated:

Intensive research has revealed that a problem of the prior art device shown in FIGS. 1-7 is that ingress of moisture and/or oxygen occurs because of the fact that the encapsulation layer system does not close off the light emitting area at the edge of the bank structure 4 adjacent the second sides 3. Details II and III indicated in FIG. 1 are depicted in FIGS. 2 and 3 and even in more detail in FIG. 4. The research shows that the edges 5a of the metal contacts 5 are uneven and brittle. This is caused by the fact that the contacts are formed of several layers of metal alloy, e.g. MoCr, Al, MoCr which layers are etched away to form the contacts 5. Because Al etches faster than MoCr, the contacts 5 are undercut which makes the edges 5a of the contacts 5 brittle. The metal flakes 10 (see FIGS. 2, 5 and 7) can lead to damage of the encapsulation layer structure to be subsequently formed. It should be noted that also etched layers for forming the anode lines or contacts made from different materials are sometimes uneven which can lead to similar problems. Further, as shown in FIGS. 2-5, at the crossings of the edge 4a of the bank structure 4 and the edge 5a of a metal contact 5a hole 11 is formed. The hole 11 cannot effectively be closed off by an encapsulation layer system and moisture and oxygen will ingress through the holes 11 to the light emitting area 1.

These problems are solved with the embodiment shown in FIG. 8. In this device the photoresist layer 4 forming the bank structure 4 is enlarged relative to the layer in the device according to the prior art, i.e. to the effect that it fully extends over contacts 5 adjacent the at least one second sides 3 except for a contact position 14 (see FIGS. 5 and 6) per cathode line to be formed, via which an electric contact between a respective cathode line to be formed and a respective contact 5 is established. By this feature, the brittle edges 5a of the contacts 5 are made smooth and the holes 11 are covered. Consequently, the encapsulation layer structure to be deposited subsequently will more easily conform and the risk of disruption of the encapsulation layer structure is minimized. Closing off of the sides 3 is of the utmost importance because moisture will penetrate very quickly along the cathode separators 9 into the light emitting area 1. This will immediately lead to loss of the OLED.

It should be noted that FIGS. 1-7 of WO2006/071106 are substantially the same as in the present application and that reference numbers 1-14 refer to the same parts.

The present invention relates to a related problem but provides a different solution. The problem is caused by the fact that the at least one contact has a structure or is made from a material which makes it difficult to obtain a perfect seal with the encapsulation layer system.

The MoCr, Al, MoCr layer structure for the contacts is used because of its high conductivity and its durability. The first MoCr-layer is for a better adherence of the Al on the substrate. The Al-layer is for providing a low resistance conductivity. The second MoCr-layer is for protection of the Al-layer against corrosion.

Other types of contacts can be porous. Such contacts can e.g. be formed by printing an Al or Ag containing paste on the substrate and subsequently heating the paste. This is a very cost effective manner to apply contacts and/or contact lines on a substrate without difficult CVD or PECVD techniques or etching steps.

In other instances, the contacts may be formed from an organic material. Such organic materials are, in most cases, not fit for forming a perfect seal when an encapsulation layer system is applied thereon. This is because the organic material might transport moisture, oxygen or other such unwanted substances.

As stated above, the contacts have the problem of not being able to properly seal them against the ingress of moisture and oxygen with a encapsulation layer system.

In order to solve this problem, according to the invention, in the method defined in the preamble hereabove
the at least one contact comprises a shunt, i.e. an interruption which interruption is bridged by a electrically conductive bridge;
the first inorganic layer of the encapsulation system being applied so that it is in direct physical contact with the electrically conductive bridge;
the bridge having a structure and shape which can be sealingly covered by the encapsulation layer system and is made from a material through which no moisture and/or oxygen can penetrate.

By virtue of the direct physical contact between the first inorganic layer of the encapsulation system with the shunt with the special electrically conductive bridge having a structure and shape which can be sealingly covered by the encapsulation layer system and is made from a material through which no moisture and/or oxygen can penetrate, the problem of water and moisture ingress towards the sealed off area is prevented.

In a further elaboration of the invention the bridge in the shunt can be a layer of a transparent conductive oxide, such as ITO. For an OLED such a layer has to be applied anyway in the light emitting area. Because the length of the shunt can be made short, the higher resistance of the ITO relative to Al does not constitute a problem. On the other hand, from a process point of view, it is advantageous to use the ITO as bridge material because there is a process step for applying the ITO anyway and because the ITO is dense and therefore not penetrable by moisture and oxygen. Further, a good adherence between the ITO and the first inorganic layer of the encapsulation layer system is feasible.

In an alternative embodiment, the bridge in the shunt can be a layer of a transparent conductive oxide, such as ITO, and on top of that a layer of MoCr.

In still another alternative embodiment, the bridge in the shunt can be a layer of a transparent conductive oxide, such as ITO, and on top of that a layer of MoCr and a layer of Al.

As stated above, the at least one contact can comprise a layer of MoCr, on top of that a layer of Al and on top of that a layer of MoCr.

In an alternative embodiment the at least one contact can comprise a porous conductive material. The porous conductive material can include Al or Ag which has been applied by a printing technique and subsequently has been heated.

In still another alternative embodiment, the at least one contact can comprise an organic conductive material.

The at least one contact of the electronic device of the preamble recited above has, according to the invention, a structure or is made from a material which makes it difficult to obtain a perfect seal via the encapsulation layer system,
  the at least one contact comprising a shunt, i.e. an interruption which interruption is bridged by a electrically conductive bridge;
  the first inorganic layer of the encapsulation system being applied so that it is in direct physical contact with the electrically conductive bridge;
  the bridge having a structure and shape which can be sealingly covered by the encapsulation layer system and is made from a material through which no moisture and/or oxygen can penetrate.

In an embodiment the electronic device can be an organic light emitting device comprising;
  parallel conductive lines extending in a first direction;
  first contacts being in electrical contact with the first conductive lines;
  second contacts;
  first contact lines;
  second contact lines, the second contacts having a shunt with a said bridge;
  active layers, amongst which at least light emitting polymers, on at least portions of the first conductive lines to form a light emitting area; and
  second parallel conductive lines which extend in a second direction crossing the first direction and being in electrical contact with the second contacts.

In many instances, the substrate is provided with a connector for connecting the OLED to a control chip. The first contact lines and the second contact lines can form the connection between the connector and the first and the second contacts respectively. However, it is also possible that not only contact lines are present between the connector and the first and the second contacts but that control electronics are applied to the substrate between the connector and the first and the second contacts.

In the above defined OLED, apart from the second contacts also the first contacts can have a shunt with a said bridge.

In alternative embodiment of the electronic device the electronic device can be a solar cell, an organic electronic device, organic solar cells, Si-devices which have to be protected against moisture and/or oxygen or other gases, sensor devices in which the sensor area has to be protected against moisture, oxygen or another gas, etc.

As described in WO2006/071106,the ingress of water and moisture into the light emitting area of an OLED, more specifically an OLED of the passive type, is most likely to occur in the direction of the second conductive lines, i.e. from the second sides of the light emitting area. This is because the second conductive lines are in most events formed between socalled cathode separators which provide a shadowing structure for the conductive layer which is applied to form the second conductive lines. The ingress of water and moisture into the light emitting area is promoted by the capillary effect along those cathode separators.

Of course, also with OLED's of the active type, the ingress of moisture and oxygen has to be prevented and there is a eminent danger for such ingress, even in the absence of cathode separators.

The shunt in each second contact provides an area along the second sides which is free from flakes, irregularities and undercut portions in the second contacts. The first inorganic layer of the encapsulation system, which is a real good barrier against water, moisture and oxygen, is along the second sides of the light emitting area in direct physical contact with the shunt of each second contact and between the second contacts in direct contact with the substrate. Tests have shown that a perfect encapsulation is obtained with such a construction. This is probably due to the fact that the first inorganic layer is not damaged by flakes, irregularities and/or undercut portions in the second contacts. The ingress of oxygen, moisture and/or water is reduced to the minimum which is essential for the durability of the OLED.

Relative to the solution described in WO2006/071106,the substrate of the OLED can be smaller while maintaining the same dimension of the light emitting area. This is because the border width around the light emitting area is smaller because the bank structure providing the pixel compartments does not have to extend fully over the contacts as is the case in WO2006/071106.

Further, the conductive layer still present in the shunt can be chosen such that a very good adherence between the first inorganic layer and the conductive layer is provided.

Although less vulnerable to the ingress of water, moisture and oxygen, the first sides of light emitting area can be better protected as well against the ingress of water, moisture and/or oxygen by providing a method and an OLED which, according to a further elaboration of the invention the first contacts comprise a shunt with a said bridge as well.

The shunt in each first contact provides an area along the first sides which is free from flakes, irregularities and undercut portions in the first contacts. The first inorganic layer of the encapsulation system, which is a real good barrier against water, moisture and oxygen, is along the first sides of the light emitting area in direct physical contact with the shunt of each first contact and between the first contacts in direct contact with the substrate. A perfect encapsulation is obtained with such a construction, probably due to the fact that the first inorganic layer is not damaged by flakes, irregularities or undercut portions in the first contacts. The ingress of oxygen, moisture or water is reduced to a minimum which is essential for the durability of the OLED.

For the same reasons as described above, the substrate of the OLED can be smaller relative to the solution described in WO2006/071106 while maintaining the same dimension of the light emitting area. Further, the conductive layer still present in the shunt can be chosen such that a very good adherence between the first inorganic layer and the conductive layer is provided.

In an embodiment of the invention the first and/or the second contacts can have a structure composed of a bottom layer of the same material as the first conductive lines, and on top of that a conductive layer structure.

From a process efficiency point of view, this is advantageous because the material of the first conductive lines has to be applied anyway so that the process steps for applying these first conductive lines can also be used for forming the bottom layer of the first and/or second contacts.

The material of which the first conductive lines and the bottom layer of the first and/or the second contacts are made from can be a conductive transparent oxide such as ITO.

The first inorganic layer has a very good adherence to the conductive transparent oxide. Further, the conductive transparent oxide, such as e.g. ITO (indium tin oxide), can be applied with a very smooth upper surface without irregularities, flakes, undercut areas and the like. Consequently, a very good encapsulation of the light emitting area is provided.

The conductive layer structure on top of the bottom layer of the first and/or second contacts can be composed of a layer of MoCr, a layer of Al and a layer of MoCr. Such a conductive layer structure has a low resistance and is durable.

In an embodiment of the invention, the conductive layer structure on top of the bottom layer is not present at the position of the shunt of a said first and/or second contact.

In another embodiment of the invention, the upper layer of MoCr of the conductive layer structure on top of the bottom layer is not present at the position of the shunt of a said first and/or second contact.

In still another embodiment of the invention, the upper layer of MoCr and the layer of Al are not present at the position of the shunt of a said first and/or second contact.

According to a further elaboration of the invention, the shunt in each first and/or second contact can be formed by removing at least one of the upper layers of the first and/or second contact in an area forming the shunt. Alternatively, it is also possible to not apply the at least one of the upper layers of the first and/or second contacts in the area forming the shunt.

The removal can be done by etching, e.g. wet or dry (plasma) etching.

The encapsulation system can comprise a stack of organic and inorganic layers. The first layer of the stack applied can be the first inorganic layer. However, it also possible that before applying the first inorganic layer, first an organic layer is applied. In that case, the organic layer should not cover the shunt portions of the contacts. Indeed, the first inorganic layer should be in direct physical contact with the shunts of the contacts provided with such a shunt.

The layers of the encapsulation system applied after the first inorganic layer may extend over a larger area than the first inorganic layer so that the first inorganic layer is covered completely by at least one of the subsequent layers of the encapsulation system. Thus the number of barriers between the environment and the light emitting area is increased, thereby reducing the risk of ingress of moisture, water and/or oxygen to the light emitting area.

In a further elaboration of the invention, the first inorganic layer of the encapsulation system has a circumferential edge which is in direct physical contact with at least each second contact at the position of the shunt thereof and optionally also with each first contact at the position of the shunt thereof.

Such a construction provides the possibility of reducing the border width around the light emitting area to the minimum.

The first inorganic layer can be composed of a material chosen from the group consisting of all combinations of Al, Si or Ge with N, O or C, such as SiN, $SiO_x$, GeN etc. Generally, any ceramic layer which closes off against moisture and oxygen can be applied.

To provide a high manufacturing efficiency, the first and the second contacts can be formed in the same process steps.

For the same reason the first contact lines can be formed in the same process steps as the first contacts and the second contact lines can be formed in the same process steps as the second contacts. It will be clear that the contact lines can be composed only of the conductive layer structure without the bottom layer present in at least the second contacts. In the contact lines, the conductive layer structure may comprise only one layer or several layers, e.g. a structure of MoCr, Al and MoCr.

The invention also includes an OLED obtained with the method according to the invention.

The invention will be further elucidated by means of a practical embodiment with reference to the accompanying drawing in which.

Figure 1:
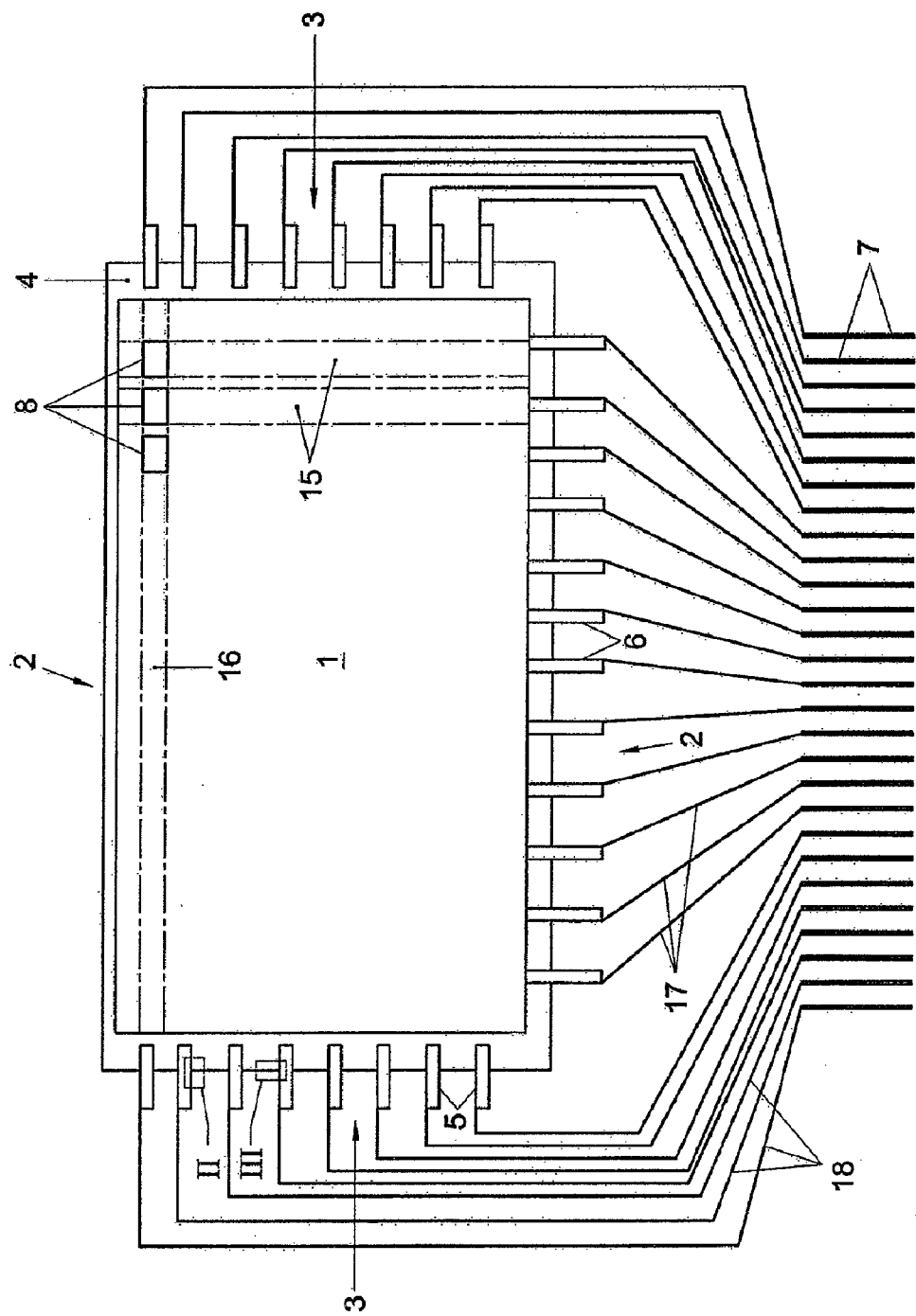
FIG. 1 shows a schematic top view of a prior art OLED (organic light emitting device)

The known OLED shown in FIG. 1-7 has a light emitting area 1 having first sides 2 and second sides 3. The OLED comprises a substrate S (see FIG. 7) from e.g. glass, transparent plastic or the like. In the light emitting area 1 parallel anode lines 15 are provided on the substrate which extend between the first sides 2. The anode lines 15 are preferably made of conductive transparent oxide such as ITO. Further, the substrate is provided with first contacts 6 along a first side 2 of the light emitting area 1. Second contacts 5 are provided along the second sides 3 of the light emitting area 1. Further a connector part 7 is provided on the substrate. The first contacts 6 are connected to the connector part 7 via contact lines 17. The second contacts 5 are connected to the connector part 7 via contact lines 18. In use, the OLED will be connected to a control chip which is connected to the connector part 7. The light emitting area is covered by a photoresist layer 4 in which pixel compartments 8 are provided. The photoresist layer 4 is indicated in the art by "bank structure". In the light emitting area 1 cathode separators 9 (see FIGS. 3, 5 and 6) are provided on the bank structure 4. The cathode separators 9 can be formed by a relatively thick layer of photoresist which is partly etched away to form the cathode separators 9 which extend between the second sides 3 of the light emitting area 1. The cathode separators 9 provide a shadowing structure, known per se, which interrupts a conductive layer to be deposited thereon. Thus parallel cathode lines 16 are formed which extend between the second sides 3 of the light emitting area 1. The cathode lines 16 cover the pixel compartments 8 in the bank structure 4. Before the cathode lines 16 are formed, the pixel compartments 8 are filled with light emitting material (LEP) such as PPV and with an hole injection layer (HIL) that increases the light emitting effect such as PEDT, which materials are known in the art. Application of HIL and LEP can be done by inkjet printing.

After having deposited the HIL, the LEP and the cathode lines, the light emitting area 1 is closed off by an encapsulation layer system comprising a stack of inorganic and organic layers.

Figure 2:
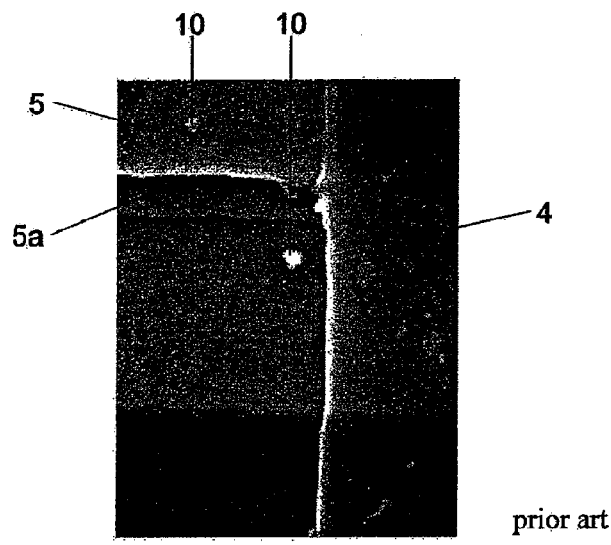
FIG. 2 shows detail II of FIG. 1.
Figure 3:
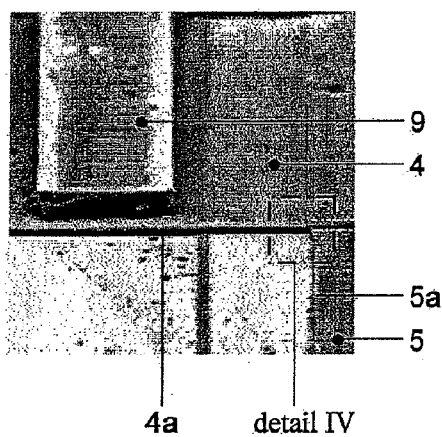
FIG. 3 shows detail III of FIG. 1.
Figure 4:
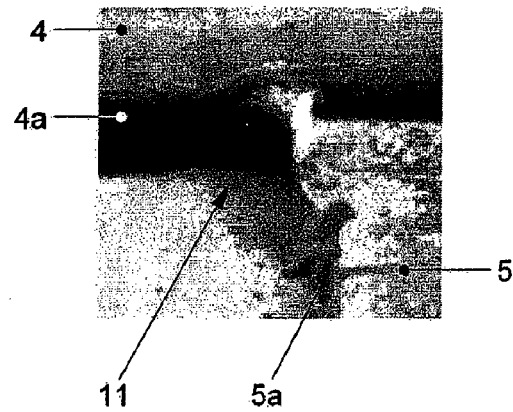
FIG. 4 shows detail IV of FIG. 3.

Intensive research has revealed that a problem of the prior art device shown in FIGS. 1-7 is that ingress of moisture and/or oxygen occurs because of the fact that the encapsulation layer system does not close off the light emitting area at the edge of the bank structure 4 adjacent the second sides 3. Details II and III indicated in FIG. 1 are depicted in FIGS. 2 and 3 and even in more detail in FIG. 4. The research shows that the edges 5a of the metal second contacts 5 are uneven and brittle. This is caused by the fact that the contacts are formed of several layers of metal alloy, e.g. MoCr, Al, MoCr which layers are etched away to form the contacts 5. Because Al etches faster than MoCr, the contacts 5 are undercut which makes the edges 5a of the contacts 5 brittle. The metal flakes 10 (see FIGS. 2, 5 and 7) can lead to damage of the encapsulation layer structure to be subsequently formed. It should be noted that also etched layers for forming the anode lines or contacts made from different materials are sometimes uneven which can lead to similar problems. Further, as shown in FIGS. 2-5, at the crossings of the edge 4a of the bank structure 4 and the edge 5a of a metal contact 5 a hole 11 is formed. The hole 11 cannot effectively be closed off by an encapsulation layer system and moisture and oxygen will ingress through the holes 11 to the light emitting area 1.

The following description relates to one embodiment of the invention. Several other embodiments are also possible.

Figure 8:
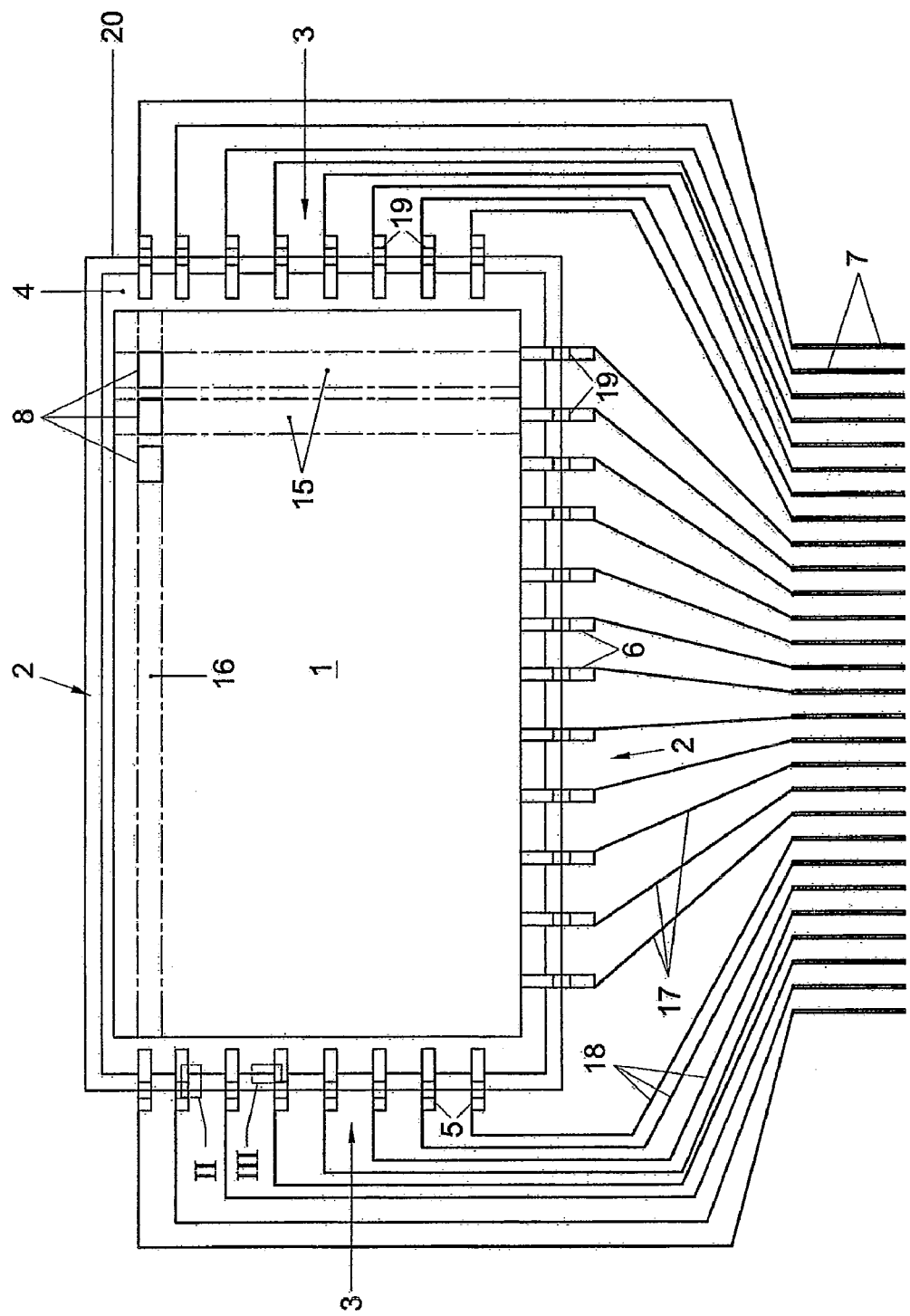
FIG. 8 shows a top view of an embodiment of an OLED according to the invention.

FIG. 8 shows a top view of an embodiment of the invention in which the first contacts 6 and the second contacts 5 are each provided with a shunt 19, i.e. an interruption which interruption is bridged by an electrically conductive bridge. A first inorganic layer 20 of an encapsulation system composed of a stack of organic and inorganic layers covers the light emitting area 1. The first inorganic layer 20 is in direct physical contact with the shunt 19 of each first and second contact 6, 5. More specifically, the circumferential edge 20a of the first inorganic layer 20 is in direct physical contact with the shunt 19 of the contacts 5, 6. It should be noted that the shunts in the first contacts 6 are optional. The bridge of the shunt 19 has a structure and shape which can be sealingly covered by the encapsulation layer system and is made from a material through which no moisture and/or oxygen can penetrate.

Figure 5:
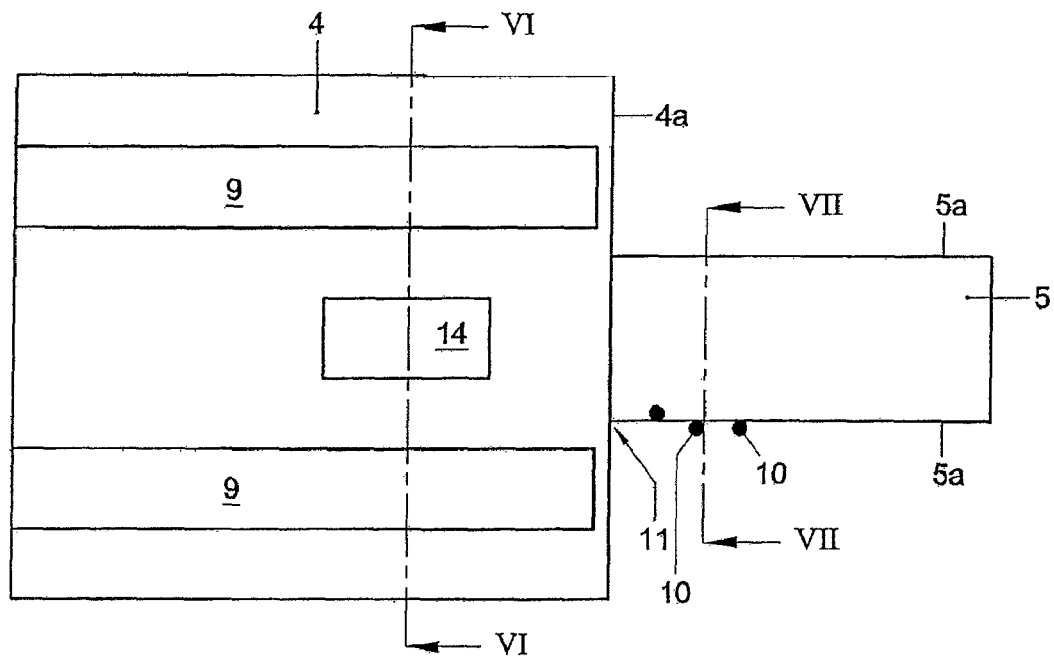
FIG. 5 shows detail V of FIG. 1.
Figure 6:
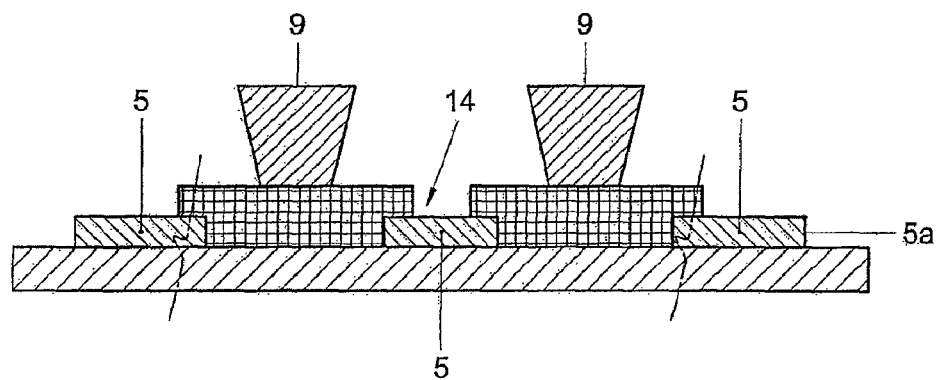
FIG. 6 shows cross section VI-VI of FIG. 5.
Figure 7:
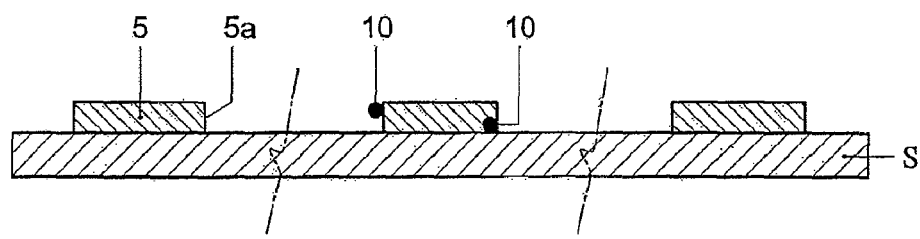
FIG. 7 shows cross section VII-VII of FIG. 5.
Figure 9:
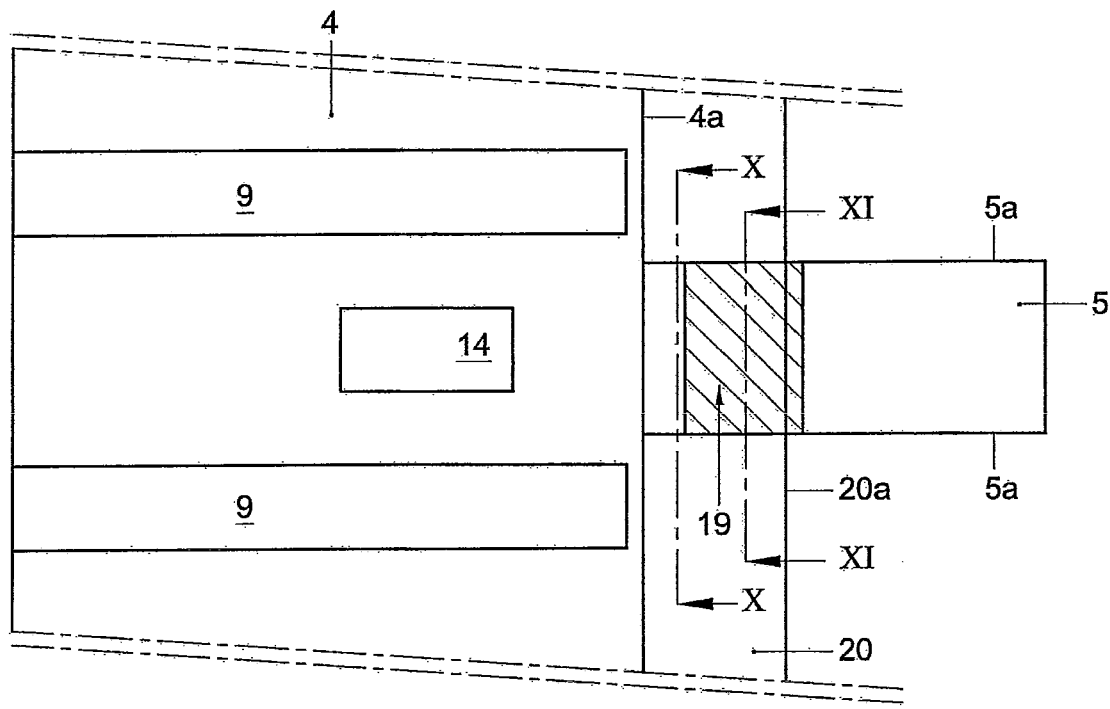
FIG. 9 shows a corresponding detail as shown in FIG. 5, however, now from an embodiment of the invention.
Figure 12:
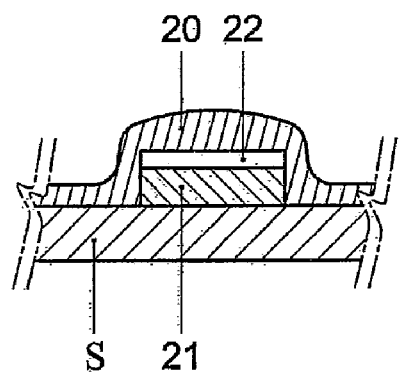
FIG. 12 shows a corresponding cross section over line XI-XI of FIG. 8 of another embodiment.
Figure 13:
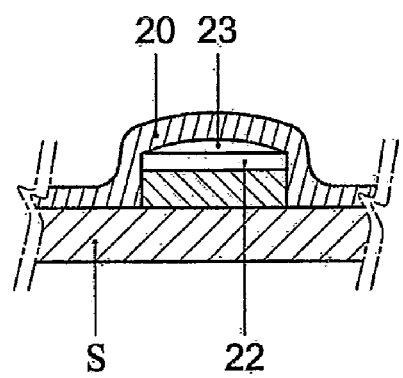
FIG. 13 shows a corresponding cross section over line XI-XI of FIG. 8 of still another embodiment.

FIG. 9 shows a corresponding detail as shown in FIG. 5, however, now from the embodiment of the invention shown in FIG. 8. The shunt 19 on second contact 5 has been indicated with a cross hatch. The circumferential edge 20a of the first inorganic layer is clearly visible. The first inorganic layer 20 extends in this figure left from the edge 20a. FIG. 9 indicates two cross sections of which the X-X is shown in FIG. 10 and XI-XI is shown in FIGS. 11-13 each depicting a different embodiment of the invention.

Figure 10:
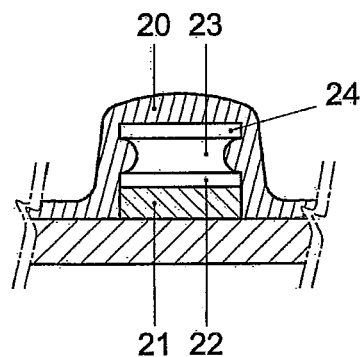
FIG. 10 shows a cross section over line X-X of FIG. 9.

The cross section of FIG. 10 shows the substrate S at the position of the second contact 5 and a bottom layer 21 of conductive transparent oxide such as e.g. ITO. On top of that bottom layer 21 is a conductive layer structure. In this embodiment, the conductive layer structure comprises a layer 22 of MoCr, a layer 23 of Al and a layer 24 of MoCr. Due to the fact that Al etches quicker than MoCr, layer 23 can have undercut side edges. At cross section X-X, the first inorganic layer 20 of the encapsulation system is present. On top of that layer 20, various other encapsulation layers may be present which are not depicted in FIG. 10. Thus a stack of subsequent inorganic and organic layers may be provided to form the encapsulation system.

In order to provide a better encapsulation, a shunt 19 has been provided on at least each second contact 5 and optionally also on the first contacts 6.

Figure 11:
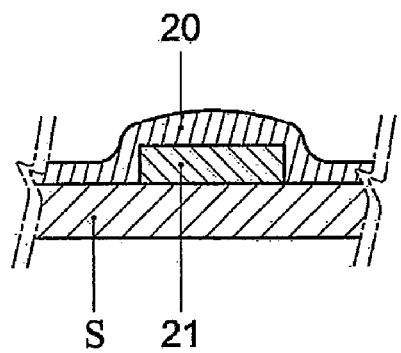
FIG. 11 shows a cross section over line XI-XI of FIG. 9

FIG. 11 shows a cross section over line XI-XI of FIG. 9 of a first embodiment of the invention. In this embodiment, the whole conductive layer structure on top of bottom layer 21 is not present, e.g. removed or, alternatively, not applied. Bottom layer 21 is smooth and does not have undercut portions. Consequently, the adherence of the first inorganic layer 20 on top of the bottom layer 21 and the surrounding substrate S is very good, thus preventing ingress of moisture, water and/or oxygen.

FIG. 12 shows a second embodiment of the invention in which the upper MoCr layer 24 and the Al-layer 23 are not present. Such an embodiment is also feasible because the undercut portions are not present and the presence of flakes or other irregularities is substantially reduced.

FIG. 13 shows a third embodiment of the invention in which only the upper MoCr layer 24 is not present. For this embodiment, the same feasibility reasons are present as for the embodiment of FIG. 12.

In the depicted embodiments the circumferential edge 20a of the first inorganic layer 20 is in direct physical contact with the shunt 19 of each contact 5 and 6. However, it is also possible that the first inorganic layer 20 covers a larger area, e.g. the area defined by the ends of the contacts 5, 6 facing away from the light emitting area 1, or the entire substrate surface with exception of the connector 7.

It is also clear that other materials for the conductive structure on top of the bottom layer 21 of the contacts 5 and/or 6 is possible and that a different material than conductive transparent oxide is used for the bottom layer 21 of the contacts. The point is that the layer(s) on top of which the first inorganic layer 20 is applied at the shunt is smooth, without irregularities, undercut portions and the like, thus providing a good encapsulation of the light emitting area and thus providing a barrier which cannot be penetrated by moisture or oxygen.

Various modifications within the scope of the appended claims are possible. The method can also provide electronic devices of an entirely different type, e.g.:

OLED's of the active matrix type in stead of the passive matrix type;

Solar cells;

organic electronic devices;

organic solar cells;

Si-devices of which an area has to be protected against moisture or gas.

Generally, the devices have an area which has to be sealed off from the environment by an encapsulation layer system and which has contacts extending from the sealed off area to a non-sealed part of the device, which contacts would create moisture or gas ingress towards the area due to the material of which the contacts are made or due to the structure and/or form of the contacts if no special measures as proposed by the invention were taken.

The invention claimed is:

1. Method for manufacturing an electronic device comprising at least:
    providing a substrate;
    providing an area on the substrate which has to be protected against moisture and/or oxygen;
    providing at least one contact;
    providing an encapsulation layer system comprising at least a first inorganic layer which is the first inorganic layer of the encapsulation system applied when forming the encapsulation system, the encapsulation system at least sealing the area to be protected against moisture and/or oxygen,
    wherein the at least one contact extends from the said sealed area to a part of the substrate not sealed by the encapsulation layer system, the contact having a structure or being made from a material which makes the contact difficult to obtain a perfect seal via the encapsulation layer system,
    wherein the at least one contact comprises a bottom layer, at least an upper layer, and a shunt, said shunt being an interruption bridged by an electrically conductive bridge, the electrically conductive bridge having a structure and shape which can be sealingly covered by the encapsulation layer system and is made from a material through which no moisture and/or oxygen can penetrate; and
    wherein the first inorganic layer of the encapsulation system is applied so that the first inorganic layer is in direct physical contact with the electrically conductive bridge; and
    forming the shunt with the electrically conductive bridge by removing or not applying at least one of the at least one upper layer of the contact in an area forming the shunt.

2. Method according to claim 1, wherein the bridge in the shunt is a layer of a transparent conductive oxide, such as ITO.

3. Method according to claim 1, wherein the bridge in the shunt is a layer of a transparent conductive oxide, such as ITO, and on top of that a layer of MoCr.

4. Method according to claim 1, wherein the bridge in the shunt is a layer of a transparent conductive oxide, such as ITO, and on top of that a layer of MoCr and a layer of Al.

5. Method according to claim 1, wherein the at least one contact comprises a layer of MoCr, on top of that a layer of Al and on top of that a layer of MoCr.

6. Method according to claim 1, wherein the at least one contact comprises a porous conductive material or an organic conductive material.

7. Method according to claim 6, wherein the porous conductive material is Al or Ag which has been applied by a printing technique and subsequently has been heated.

8. Method according to claim 1, wherein for manufacturing an organic light emitting device the method further comprises at least:
    forming first parallel conductive lines which extend in a first direction;
    forming first contacts being in electrical contact with the first conductive lines;
    forming second contacts;
    forming first contact lines;
    forming second contact lines;
    providing active layers, amongst which at least light emitting polymers, on at least portions of the first conductive lines to form a light emitting area; and
    forming second parallel conductive lines which extend in a second direction crossing the first direction and being in electrical contact with the second contacts;
    the second contacts having a shunt with said bridge.

9. Method according to claim 8, wherein the first contacts comprise a shunt with said bridge as well.

10. Method according to claim 8, wherein the first and/or the second contacts have a structure composed of a bottom layer of the same material as the first conductive lines, and on top of that a conductive layer structure.

11. Method according to claim 10, wherein material of which the first conductive lines and the bottom layer of the first and/or the second contacts are made from is a conductive transparent oxide such as ITO.

12. Method according to claim 10, wherein the conductive layer structure on top of the bottom layer of the first and/or second contacts is composed of a layer of MoCr, a layer of Al and a layer of MoCr.

13. Method according to claim 10, wherein at the position of the shunt of a said first and/or second contact the conductive layer structure on top of the bottom layer is not present.

14. Method according to claim 12, wherein at the position of the shunt of a said first and/or second contact the upper layer of MoCr is not present.

15. Method according to claim 12, wherein at the position of the shunt of said first and/or second contact the upper layer of MoCr and the layer of Al are not present.

16. Method according to claim 1, wherein the shunt in a contact is formed by removing at least one of the upper layers of the contact in an area forming the shunt.

17. Method according to claim 16, wherein the removal is done by etching, said etching being wet or dry etching.

18. Method according to claim 1, wherein the encapsulation system comprises a stack of organic and inorganic layers.

19. Method according to claim 18, wherein the layers of the encapsulation system applied after the first inorganic layer extend over a larger area than the first inorganic layer so that the first inorganic layer is covered completely by at least one of the subsequent layers of the encapsulation system.

20. Method according to claim 1, wherein the first inorganic layer of the encapsulation system has a circumferential edge which is in direct physical contact with each contact at the position of the shunt thereof.

21. Method according to claim 2, wherein the first inorganic layer of the encapsulation system has a circumferential edge which is in direct physical contact with each contact at the position of the shunt thereof.

22. Method according to claim 1, wherein the first inorganic layer is composed of a material chosen from the group consisting of all combinations of Al, Si or Ge with N, O or C, such as SiN, $SiO_x$, GeN etc.

23. Method according to claim 8, wherein the first and the second contacts are formed in the same process steps.

24. Method according to claim 8, wherein the first contact lines are formed in the same process steps as the first contacts.

25. Method according to claim 8, wherein the second contact lines are formed in the same process steps as the second contacts.

26. Electronic device comprising at least:
    a substrate;
    an area on the substrate which has to be protected against moisture and/or oxygen;
    at least one contact; and an encapsulation layer system comprising at least a first inorganic layer which is the first inorganic layer of the encapsulation system applied when forming the encapsulation system, the encapsulation system at least sealing the area to be protected against moisture and/or oxygen, wherein the at least one contact extends from the said sealed area to a part of the substrate not sealed by the encapsulation layer system, the contact having a structure or being made from a material which makes the contact difficult to obtain a perfect seal via the encapsulation layer system, wherein the at least one contact comprises a bottom layer, at least one upper layer and a shunt, the shunt being an interruption bridged by an electrically conductive bridge, the electrically conductive bridge having a structure and shape which can be sealingly covered by the encapsulation layer system and is made from a material through which no moisture and/or oxygen can penetrate; and wherein the first inorganic layer of the encapsulation system is applied so that the first inorganic layer is in direct physical contact with the electrically conductive bridge, and the shunt with the electrically conductive bridge is formed by removing or not applying at least one of the at least one upper layer of the contact in an area forming the shunt.

27. Electronic device according to claim 26, wherein the device is an organic light emitting device comprising;
 parallel conductive lines extending in a first direction;
 first contacts being in electrical contact with the first conductive lines;
 second contacts;
 first contact lines;
 second contact lines, the second contacts having a shunt with a said bridge;
 active layers, amongst which at least light emitting polymers, on at least portions of the first conductive lines to form a light emitting area; and
 second parallel conductive lines which extend in a second direction crossing the first direction and being in electrical contact with the second contacts.

28. Organic light emitting device according to claim 27, in which the first contacts also have shunt with a said bridge.

29. Organic light emitting device obtained with the method according to claim 1.

30. Electronic device according to claim 26, wherein the substrate is impermeable to moisture and oxygen.

31. Electronic device according to claim 30, wherein the substrate, for the purpose of making it impermeable to moisture and oxygen, is provided with a coating comprising one or more layers.

* * * * *